(12) United States Patent
Kang et al.

(10) Patent No.: US 6,452,828 B1
(45) Date of Patent: Sep. 17, 2002

(54) DYNAMIC RANDOM ACCESS MEMORY (DRAM) HAVING A STRUCTURE FOR EMPLYING A WORD LINE LOW VOLTAGE

(75) Inventors: Sang-Seok Kang; Jong-Hyun Choi; Jong-Eon Lee, all of Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/886,202

(22) Filed: Jun. 20, 2001

(30) Foreign Application Priority Data

Oct. 18, 2000 (KR) .............................. 00-61256

(51) Int. Cl.[7] ................................ G11C 5/06
(52) U.S. Cl. ..................... 365/63; 365/52; 365/191; 365/230.08
(58) Field of Search .............. 365/63, 230.06, 365/230.03, 191, 52

(56) References Cited

U.S. PATENT DOCUMENTS 6,180,448 B1 * 1/2001 Lee ........................... 438/253

* cited by examiner

Primary Examiner—David Nelms
Assistant Examiner—Gene N. Auduong
(74) Attorney, Agent, or Firm—Marger Johson & McCollom, P.C.

(57) ABSTRACT

Disclosed is a dynamic random access memory (DRAM) device having word line low voltage supply lines for driving word lines in a mesh structure. The DRAM device includes a plurality of cell arrays each of which is formed of memory cells coupled to word lines and bit lines in a matrix. The memory device further includes regions of sense amplifiers disposed between the cell arrays arranged along the row direction, regions of word line drivers disposed between the cell arrays arranged along the column direction, conjunction regions disposed at positions adjacent to the regions of the sense amplifiers and word line drivers, and a plurality of word line low voltage supply lines disposed on the conjunction regions. The word line low voltage supply lines are electrically interconnected for each other at least on the conjunction regions. According to the layout arrangement, loadings of the word line low voltage supply lines are almost equally distributed, and thereby word line low noise are decreased.

10 Claims, 2 Drawing Sheets

DYNAMIC RANDOM ACCESS MEMORY (DRAM) HAVING A STRUCTURE FOR EMPLYING A WORD LINE LOW VOLTAGE

This application relies for priority upon Korean Patent Application No. 2000-61256, filed on Oct. 18, 2000, the contents of which are herein incorporated by reference in their entirety.

1. Field of the Invention

The present invention relates generally to semiconductor integrated circuit memories, and more particularly to a structure of word line low voltage supply lines in dynamic random access memory (DRAM) devices capable of minimizing noise caused by loading differences of word line low voltage supply lines.

2. Backward line low of the Invention

A dynamic random access memory (DRAM) device as a volatile memory device includes memory cells, each consisting of a cell transistor or a switch transistor and a capacitor. The term 'cell transistor' as used here will include switch transistors. In general, the cell transistor of the memory cell is a N-channel metal-oxide semiconductor (NMOS) transistor. A retention time of data held in the memory cell is affected by a leakage current running from a source to a drain, or through a channel, in the cell transistor. The leakage current may be, generated from word line low noise arising when the word line is not sufficiently discharged to the word line low potential, even after a read/write operation is over.

FIG. 1 is a block diagram showing a layout arrangement of word line low supply lines in the conventional DRAM device.

Referring to FIG. 1, the DRAM device includes a plurality of sub arrays 10 arranged in a matrix with rows and columns, and each of the sub arrays 10 is formed of a plurality of memory cells MC coupled to word lines WL, and bit line pairs BL and /BL. Sense amplification regions 20 are disposed between the sub arrays 10 arranged along the row direction. Each of the sense amplification regions 20 includes a plurality of sense amplifiers which are connected to the bit line pairs BL and /BL extended along rows. As known in the art, the sense amplifiers in the sense amplification regions 20 are shared with the adjacent sub arrays 10.

Continuing to refer to FIG. 1, sub-word line drive regions 30 are disposed between the sub arrays 10 along the column direction. Each of the sub-word line drive regions 30 includes a plurality of word line drivers WLD. A portion of the word lines WL in each of the sub arrays 10 is selected by the word line drivers WLD of sub-word line drive regions 30 disposed on one side of the sub arrays 10, and the rest of the word lines are selected by the word line drivers WLD of sub-word line drive regions 30 disposed on the other side. Conjunction regions 40 are disposed between the sub-word line drive regions 30 along the row direction.

As well known to those skilled in the art, the foregoing structure is called a "bank". As shown in FIG. 1, the bank includes word line drive word line low supply lines VssW, array power supply lines VccA, and array word line low supply lines VssA disposed therein.

In specific, the VccA and the VssA are disposed over the sense amplifying regions 20 and the conjunction regions 40 arranged in the column direction. The VssW are disposed over the sub-word line drive regions 30 and the conjunction regions 40 arranged in the row direction, and extended along the column direction from one side of the bank. The word line drivers WLD of the sub-word line drive regions 30 are coupled to the VssW.

A word line is selected, and a read/write operation is performed. After the operation is terminated, the potential of the selected word line is discharged from a predetermined word line voltage to a word line low potential. Here, an outline of a discharging path is the selected word line, the word line driver, the VssW, and a word line low potential pad (not shown).

One end of VssW extending along the row direction retains a floating state, and the other end thereof is coupled to the word line low potential pad. Briefly, elements affecting the loading performance of the VssW are figured out in various forms at the sub-word line drive regions 30 arranged along the row direction. Thus, the selected word lines WL adjacent to the VSSW coupled to the word line low potential pad are sufficiently discharged to the word line low potential, while the other selected word lines WL far from the VSSW relative to the near-positioned word lines are not sufficiently discharged. The cell transistor connected to the word line that is insufficiently discharged to the word line low potential is slightly turned on, and thereby electric charges held in the capacitor are leaked. Subsequently, the word line low noise may reduce the data retention time.

SUMMARY OF THE INVENTION

In order to attain the above objects, an embodiment of the present invention, there is provides a dynamic random access memory (DRAM) device having a plurality of cell arrays each of which is formed of memory cells coupled to word lines and bit lines in a matrix, the device including: regions of sense amplifiers disposed between the cell arrays arranged along the row direction; regions of word line drivers disposed between the cell arrays arranged along the column direction; conjunction regions disposed at positions adjacent to the regions of the sense amplifiers and word line drivers; and a plurality of word line low voltage supply lines disposed on the conjunction regions. The word line low voltage supply lines are electrically interconnected with each other at least on the conjunction regions. The word line low voltage supply lines are connected to a word line low voltage source through a pad.

According to the constitution of DRAM device of the present invention, loading of word line low voltage supply lines for driving word lines are equally distributed over all bank regions regardless of a disposition of cell arrays.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE DETAILED EMBODIMENTS

It should be understood that the description of this embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
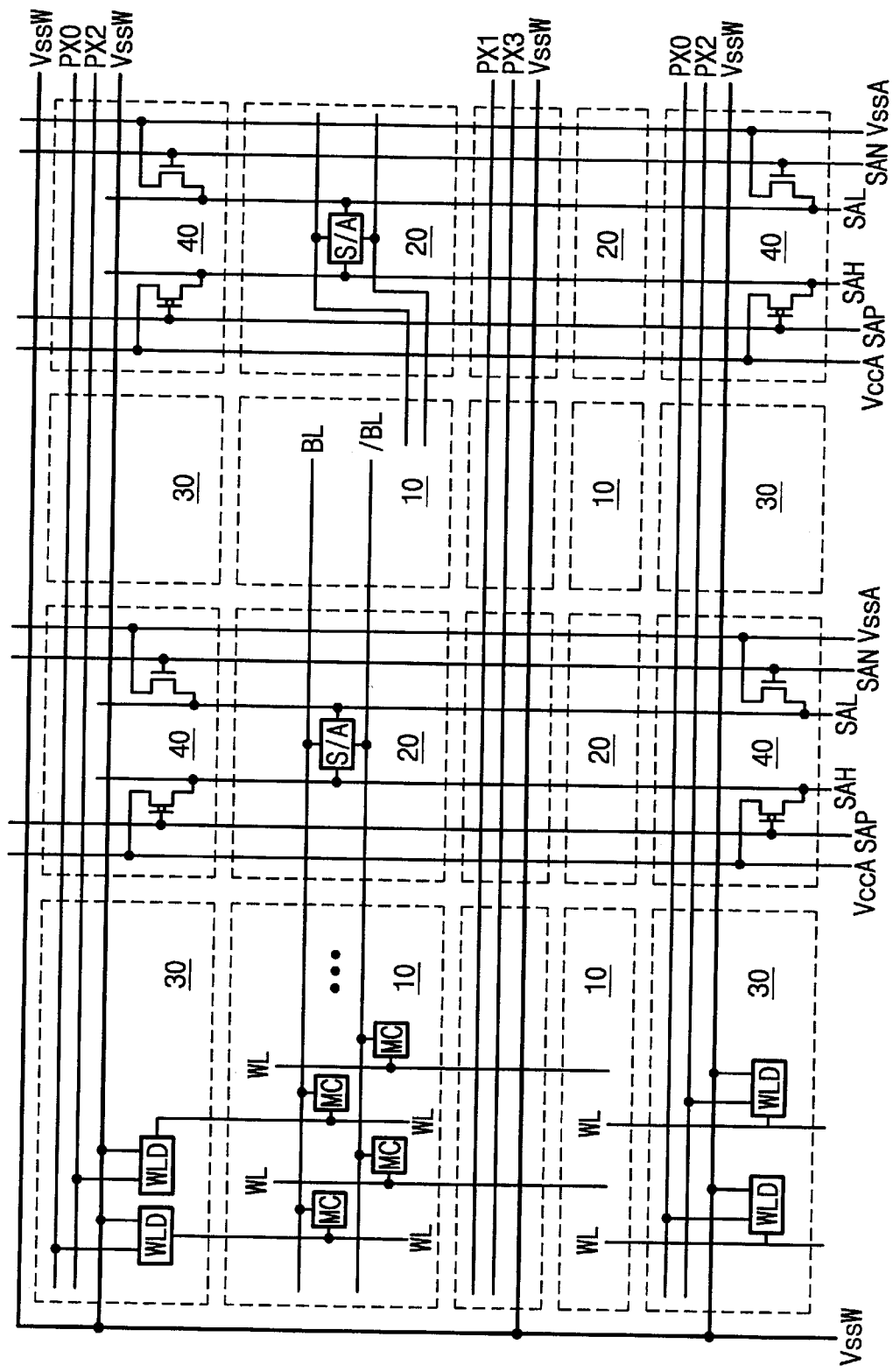
FIG. 1 is a block diagram showing a layout arrangement of word line low supply lines in dynamic random access memory (DRAM) device according to the prior art.
Figure 2:
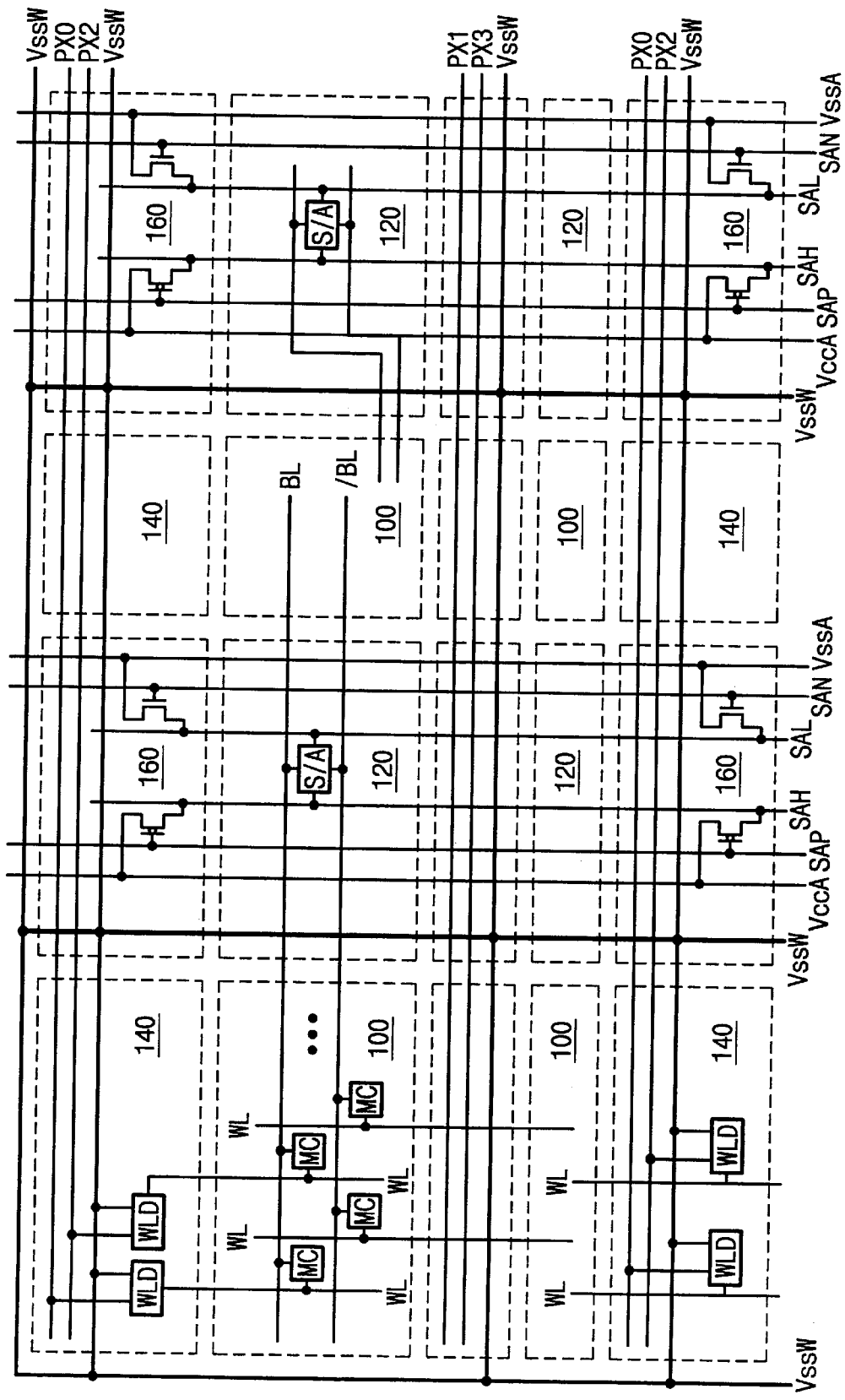
FIG. 2 is a block diagram showing a layout arrangement of word line low supply lines in DRAM device according to an embodiment of the present invention.

FIG. 2 is a block diagram of a layout arrangement of the word line low supply lines of the present invention.

Referring to FIG. 2, the DRAM device includes a plurality of sub arrays 100 arranged with rows and columns. Each of the sub arrays 100 includes a plurality of word lines WL, a plurality of bit line pairs BL and /BL, and a plurality of memory cells MC arranged in intersection regions of the word lines and the bit lines. Sense amplification regions 120 are disposed between the sub arrays 100 along the row or bit line direction. A plurality of sense amplifiers SA are provided for each of the sense amplification regions 120, and each of which is connected to the bit lines pairs BL and /BL of adjacent sub arrays 100 arranged along the row direction. The sense amplifiers SA of the sense amplification regions 120 are shared by the adjacent sub arrays 100.

Continuing to refer to FIG. 2, sub-word line drive regions 140 are disposed between the sub arrays 100 along the column or word line direction. A plurality of word line drivers WLD are provided for each of the sub word line drive regions 140. A portion of word lines WL are selected by the word line drivers WLD of the sub-word line drive regions 140 disposed on one side, and the rest of the word lines WL are selected by the word line drivers WVLD of the sub-word line drive regions 140 disposed on the other side. Conjunction regions 160 are disposed between the sub-word line drive regions 140 along the row direction.

Word line drive word line low supply lines VssW are disposed on the conjunction regions 160. The VssW lines are electrically interconnected for each other on at least one region. For example, the word line low supply lines may be electrically interconnected on the conjunction regions 160, or possible the sub word line drive regions 140. The supply lines are also connected to a word line low voltage source through a word line low potential pad.

According to such layout arrangement, loadings of word line low supply lines for driving word lines are almost equally distributed regardless of the disposition of the sub arrays, whereby word line low noise of the word lines are decreased. Consequently, the data retention time of memory cells is improved.

Although the embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor memory device having a plurality of cell arrays each of which is formed of memory cells coupled to word lines and bit lines in a matrix, the device comprising:

a. regions of sense amplifiers disposed between the cell arrays arranged along a row direction;

b. regions of word line drivers disposed between the cell arrays arranged along a column direction;

c. conjunction regions disposed between the word line drive regions; and d. a plurality of word line low voltage supply lines disposed on at least one region of the regions, e. wherein the word line low voltage supply lines are electrically interconnected together in the column direction on the conjunction regions.

2. The semiconductor memory device of claim 1, wherein the word line low voltage supply lines are connected to a word line low voltage source.

3. The semiconductor memory device of claim 1, wherein the word line low supply voltage is ground voltage level.

4. The semiconductor memory device of claim 1, wherein the word line low supply voltage is negative voltage level.

5. A semiconductor memory device having a plurality of cell arrays each of which is formed of memory cells coupled to word lines and bit lines in a matrix, the device comprising:

a. sense amplifiers regions disposed between the cell arrays arranged along a row direction;

b. word line drive regions disposed between the cell arrays arranged along a column direction;

c. conjunction regions disposed between the word line drive regions; and d. a plurality of word line low voltage supply lines composed of a plurality of first and a plurality of second word line low voltage supply lines;

e. the plurality of first word line low voltage supply lines disposed on the conjunction regions and the word line driver regions, f. the plurality of second word line low voltage supply lines disposed on the conjunction regions and the regions of sense amplifiers, g. wherein the first and second word line low voltage supply lines are electrically interconnected on the conjunction regions.

6. The semiconductor memory device of claim 1, wherein the word line low supply voltage lines are connected to a word line low voltage source.

7. The semiconductor memory device of claim 1, wherein the word line low supply voltage is at ground voltage level.

8. The semiconductor memory device of claim 1, wherein the word line low supply voltage is at a negative voltage level.

9. The semiconductor memory device of claim 1, the first word line low supply voltage lines are electrically interconnected with word line drivers on the word line drive regions.

10. The semiconductor memory device of claim 1, wherein one end of the first word line low supply voltage lines is connected to the second word line low supply voltage lines.

\* \* \* \* \*

UNITED STATES PATENT AND TRADEMARK OFFICE
CERTIFICATE OF CORRECTION

PATENT NO.    : 6,452,828 B1
DATED         : September 17, 2002
INVENTOR(S)   : Kang et al.

It is certified that error appears in the above-identified patent and that said Letters Patent is hereby corrected as shown below:

Column 1,
Line 26, "maybe, generated" should read -- maybe generated --.

Column 3,
Line 29, "WVLD" should read -- WLD --.
Line 39, "possible" should read -- possibly --.

Signed and Sealed this

Eighth Day of April, 2003

JAMES E. ROGAN
*Director of the United States Patent and Trademark Office*